(12) United States Patent
Tsukizawa et al.

(10) Patent No.: US 9,698,109 B2
(45) Date of Patent: Jul. 4, 2017

(54) ESD PROTECTION DEVICE

(71) Applicant: Murata Manufacturing Co., Ltd., Kyoto (JP)

(72) Inventors: Takayuki Tsukizawa, Kyoto (JP); Jun Adachi, Kyoto (JP); Takayuki Imada, Kyoto (JP); Takahiro Sumi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 399 days.

(21) Appl. No.: 14/615,956

(22) Filed: Feb. 6, 2015

(65) Prior Publication Data

US 2015/0155246 A1 Jun. 4, 2015

Related U.S. Application Data

(63) Continuation of application No. PCT/JP2013/070168, filed on Jul. 25, 2013.

(30) Foreign Application Priority Data

Aug. 13, 2012 (JP) ................................ 2012-179354

(51) Int. Cl.
  *H01L 23/60* (2006.01)
  *H01T 1/22* (2006.01)
  (Continued)

(52) U.S. Cl.
  CPC .............. *H01L 23/60* (2013.01); *H01B 1/14* (2013.01); *H01B 1/16* (2013.01); *H01B 1/18* (2013.01);
  (Continued)

(58) Field of Classification Search
  CPC .. H01L 23/60; H05F 3/04; H01T 4/10; H01B 1/14
  See application file for complete search history.

(56) References Cited

U.S. PATENT DOCUMENTS

| 8,724,284 B2 * | 5/2014 | Umeda | ................ H05K 9/0067 |
| | | | 361/212 |
| 2011/0222203 A1 * | 9/2011 | Adachi | ..................... H01T 1/20 |
| | | | 361/220 |

(Continued)

FOREIGN PATENT DOCUMENTS

| JP | WO 2010061519 A1 * | 6/2010 | ............... H01T 1/20 |
| JP | 2011-243492 A | 12/2011 | |

(Continued)

OTHER PUBLICATIONS

International Search Report issued in Application No. PCT/JP2013/070168 dated Sep. 3, 2013.

(Continued)

*Primary Examiner* — Scott Bauer
(74) *Attorney, Agent, or Firm* — Pearne & Gordon, LLP

(57) ABSTRACT

An ESD protection device 1 has a ceramic insulating material 10, first and second discharge electrodes 21 and 22, and a discharge-assisting section 51. The first and second discharge electrodes 21 and 22 are disposed somewhere of the ceramic insulating material 10. The discharge-assisting section 51 is located between the distal end portion of the first discharge electrode 21 and the distal end portion of the second discharge electrode 22. The discharge-assisting section 51 is an electrode configured to reduce the discharge starting voltage between the first discharge electrode 21 and the second discharge electrode 22. The discharge-assisting section 51 is made from a sintered body containing conductive particles and at least one of semiconductor particles and insulating particles. The first and second discharge electrodes contain at least one of the semiconductor material constituting the semiconductor particles and the insulating material constituting the insulating particles.

20 Claims, 2 Drawing Sheets

(51) Int. Cl.
   *H01T 4/10*    (2006.01)
   *H05K 1/02*    (2006.01)
   *H01B 1/14*    (2006.01)
   *H05F 3/04*    (2006.01)
   *H01B 1/16*    (2006.01)
   *H01B 1/18*    (2006.01)
   *H05K 3/46*    (2006.01)
   *H01L 23/498*  (2006.01)

(52) U.S. Cl.
   CPC .............. *H01T 1/22* (2013.01); *H01T 4/10* (2013.01); *H05F 3/04* (2013.01); *H05K 1/026* (2013.01); *H01L 23/49827* (2013.01); *H01L 23/49866* (2013.01); *H01L 2224/48091* (2013.01); *H01L 2224/48227* (2013.01); *H01L 2924/0002* (2013.01); *H05K 3/4697* (2013.01); *H05K 2201/0919* (2013.01); *H05K 2201/09063* (2013.01)

(56) References Cited

U.S. PATENT DOCUMENTS

| | | |
|---|---|---|
| 2011/0286142 A1 | 11/2011 | Ikeda |
| 2012/0250196 A1 | 10/2012 | Sumi et al. |
| 2013/0279064 A1* | 10/2013 | Otsubo .............. H01T 4/12 361/220 |

FOREIGN PATENT DOCUMENTS

| | | | |
|---|---|---|---|
| JP | 2012-074269 A | 4/2012 | |
| JP | WO 2012090730 A1 * | 7/2012 | .............. H01T 4/12 |
| WO | 2009/098944 A1 | 8/2009 | |
| WO | 2010/067503 A1 | 6/2010 | |

OTHER PUBLICATIONS

Written Opinion issued in Application No. PCT/JP2013/070168 dated Sep. 3, 2013.

* cited by examiner

ESD PROTECTION DEVICE

BACKGROUND OF THE INVENTION

Field of the Invention

The present invention relates to an ESD protection device.

Description of the Related Art

Various ESD protection devices have hitherto been proposed to prevent the breakdown of electronic equipment caused by electro-static discharge (ESD). For example, Patent Document 1 describes an ESD protection device that has, in a region connecting a pair of discharge electrodes to each other, a discharge-assisting section in which a conductive material coated with a nonconductive inorganic material is dispersed.

Patent Document 1: WO 2009-098944

BRIEF SUMMARY OF THE INVENTION

Providing a discharge-assisting section as described in Patent Document 1 leads to, for example, the adjustment or stabilization of the ESD characteristics of the ESD protection device.

However, ESD protection devices having a discharge-assisting section is disadvantageous in that the repeated discharge affects their ESD characteristics.

A main object of the present invention is to provide an ESD protection device that is unlikely to have its ESD characteristics deteriorated.

An ESD protection device according to the present invention has a ceramic insulating material, first and second discharge electrodes, and a discharge-assisting section. The first and second discharge electrodes are disposed somewhere of the ceramic insulating material. The discharge-assisting section is located between the distal end portion of the first discharge electrode and the distal end portion of the second discharge electrode. The discharge-assisting section is an electrode configured to reduce the voltage at which discharge starts between the first discharge electrode and the second discharge electrode. The discharge-assisting section is made from a sintered body containing conductive particles and either or both of semiconductor particles and insulating particles. The first and second discharge electrodes contain either or both of the semiconductor material constituting the semiconductor particles and the insulating material constituting the insulating particles.

In a particular aspect of an ESD protection device according to the present invention, the total quantity of the semiconductor material and the insulating material in the first and second discharge electrodes is 20% by mass or less.

In another particular aspect of an ESD protection device according to the present invention, the quantity of the insulating material in the first and second discharge electrodes is in the range of 1% by mass to 10% by mass.

In another particular aspect of an ESD protection device according to the present invention, the quantity of the semiconductor material in the first and second discharge electrodes is in the range of 1% by mass to 20% by mass.

In another particular aspect of an ESD protection device according to the present invention, the first and second discharge electrodes contain conductive particles coated with either or both of the semiconductor material and the insulating material.

In another particular aspect of an ESD protection device according to the present invention, the first and second discharge electrodes are disposed on the surface of the ceramic insulating material.

In another particular aspect of an ESD protection device according to the present invention, the first and second discharge electrodes are disposed in the ceramic insulating material.

In another particular aspect of an ESD protection device according to the present invention, the ceramic insulating material has a cavity. The first and second discharge electrodes are arranged in such a manner that their distal end portion is located in the cavity.

In another particular aspect of an ESD protection device according to the present invention, the ESD protection device further has a first outer electrode and a second outer electrode. The first outer electrode is located on the ceramic insulating material. The first outer electrode is electrically coupled with the first discharge electrode. The second outer electrode is located on the ceramic insulating material. The second outer electrode is electrically coupled with the second discharge electrode.

According to the present invention, an ESD protection device can be provided that is unlikely to have its ESD characteristics deteriorated.

DETAILED DESCRIPTION OF THE INVENTION

Figure 1:
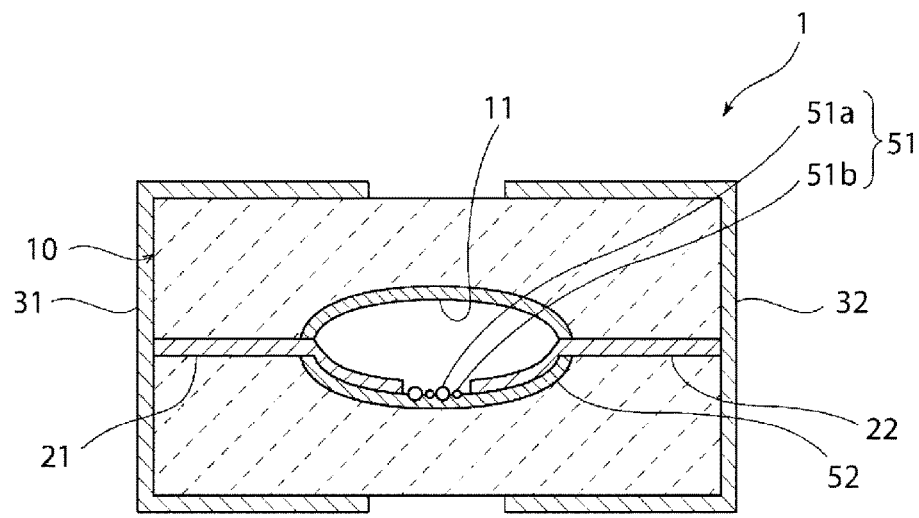
FIG. 1 is a schematic cross-sectional view of an ESD protection device according to the first embodiment.

The following illustrates one example of the preferred embodiments of the present invention. The embodiment described below is for illustration purposes only. The present invention is not limited at all to this embodiment.

In the drawings referenced in the embodiments and the like, members having substantially the same function are referenced by the same numeral. Furthermore, the drawings referenced in the embodiments and the like are schematic diagrams, and the relative dimensions and other details of the objects illustrated in the drawings may be different from those of an actual object. The relative dimensions and other details of the objects may differ even from drawing to drawing. The following description should be considered in judging the relative dimensions and other details of specific objects.

FIG. 1 is a schematic cross-sectional view of an ESD protection device according to this embodiment.

As shown in FIG. 1, the ESD protection device 1 includes a ceramic insulating material 10 having a cavity 11. The ceramic insulating material 10 has a rectangular parallelepiped shape. The ceramic insulating material 10 may be composed of appropriate insulating ceramics. More specifically, the ceramic insulating material 10 may be composed of, for example, a low temperature co-fired ceramics (LTCC) containing Ba, Al, and Si as primary components. The ceramic insulating material 10 may contain at least one of an alkali metal component and a boron component. The ceramic insulating material 10 preferably contains a glass component.

The ceramic insulating material 10 has first and second discharge electrodes 21 and 22. The first and second discharge electrodes 21 and 22 are disposed inside the ceramic insulating material 10. The distal end portion of the first discharge electrode 21 and the distal end portion of the second discharge electrode 22 are located in the cavity 11. The distal end portion of the first discharge electrode 21 and the distal end portion of the second discharge electrode 22 face each other in the cavity 11. This structure improves the response of the ESD protection device 1 and improves the durability of the ESD protection device 1.

It is not essential that the distal end portion of the first discharge electrode 21 and the distal end portion of the second discharge electrode 22 face each other. For example, the distal end portion of the first discharge electrode 21 may be located on one inner surface of the cavity 11, and the distal end portion of the second discharge electrode 22 may be located on another inner surface of the cavity 11. This means that the shape, arrangement, and other configurative details of the first and second discharge electrodes 21 and 22 are not particularly limited as long as the configuration allows discharge to occur between the distal end portion of the first discharge electrode 21 and the distal end portion of the second discharge electrode 22.

Furthermore, there may be multiple sets of first and second discharge electrodes 21 and 22.

First and second outer electrodes 31 and 32 are disposed on the outer surface of the ceramic insulating material 10. The first outer electrode 31 is electrically connected to the first discharge electrode 21. The second outer electrode 32 is electrically connected to the second discharge electrode 22.

In addition, each of the first and second discharge electrodes 21 and 22 and the first and second outer electrodes 31 and 32 may be composed of an appropriate material, such as Cu, Ag, Pd, Pt, Al, Ni, W, or an alloy containing at least one of these.

A discharge-assisting section 51 is disposed between the distal end portion of the first discharge electrode 21 and the distal end portion of the second discharge electrode 22. The discharge-assisting section 51 is capable of reducing the discharge starting voltage between the first discharge electrode 21 and the second discharge electrode 22. A more specific description is as follows. That is, providing the discharge-assisting section 51 causes a discharge that flows via the discharge-assisting section 51 to occur in addition to the surface discharge and the aerial discharge. In general, when the surface discharge, the aerial discharge, and the discharge that flows via the discharge-assisting section 51 are compared, the discharge that flows via the discharge-assisting section 51 starts at the lowest voltage. Thus, providing the discharge-assisting section 51 reduces the discharge starting voltage between the first discharge electrode 21 and the second discharge electrode 22 and, therefore, prevents the dielectric breakdown of the ESD protection device 1. Furthermore, providing the discharge-assisting section 51 improves the response of the ESD protection device 1.

The discharge-assisting section 51 is composed of a sintered body containing first particles 51a and second particles 51b. The particle diameter of the first particles 51a is larger than the particle diameter of the second particles 51b. The particle diameter of the first particles 51a can be in the range of, for example, approximately 2 μm to 3 μm. The particle diameter of the second particles 51b can be in the range of, for example, approximately 0.1 μm to 1 μm.

The first particles 51a are constituted by conductive particles. The second particles 51b are constituted by at least one of semiconductor particles and insulating particles. The semiconductor particles are particles having at least a surface layer made of a conductive material, and are not limited to particles made entirely of a semiconductor material. The insulating particles are particles having at least a surface layer made of an insulating material, and are not limited to particles made entirely of an insulating material.

The particles that constitute the second particles 51b can be semiconductor particles alone, insulating particles alone, or both of semiconductor particles and insulating particles. Specific examples of preferred conductive particles include, among others, Cu particles and Ni particles. The conductive particles may be coated with, for example, an insulating material or a semiconductor material. Specific examples of preferred semiconductor particles include, among others, particles made of silicon carbide, titanium carbide, zirconium carbide, molybdenum carbide, tungsten carbide, or any other carbide, particles made of titanium nitride, zirconium nitride, chromium nitride, vanadium nitride, tantalum nitride, or any other nitride, particles made of titanium silicide, zirconium silicide, tungsten silicide, molybdenum silicide, chromium silicide, or any other silicide, particles made of titanium boride, zirconium boride, chromium boride, lanthanum boride, molybdenum boride, tungsten boride, or any other boride, and particles made of zinc oxide, strontium titanate, or any other oxide. Specific examples of preferred insulating particles include, among others, aluminum oxide particles.

A protective layer 52 is disposed between the ceramic insulating material 10 and the distal end portion of at least one of the first and second discharge electrodes 21 and 22. More specifically, the protective layer 52 is provided in such a manner that substantially the entire inner wall of the cavity 11 is covered therewith. Providing this protective layer 52 prevents any constituent of the ceramic insulating material 10 from reaching the distal end portion, thereby limiting the decline in the discharge characteristics of the ESD protection device 1 due to the degradation of the first and second discharge electrode 21 and 22.

The protective layer 52 is preferably composed of ceramics having a sintering point higher than that of the ceramics constituting the ceramic insulating material 10. The ceramic insulating material 10 preferably contains, for example, at least one selected from the group consisting of alumina, mullite, zirconia, magnesia, and quartz.

The first and second discharge electrodes 21 and 22 of the ESD protection device 1 contain at least one of the semiconductor material and the insulating material constituting the second particles 51b. When the second particles 51b are constituted by semiconductor particles, the first and second discharge electrodes 21 and 22 contain the semiconductor material constituting the semiconductor particles. When the second particles 51b are constituted by insulating particles, the first and second discharge electrodes 21 and 22 contain the insulating material constituting the insulating particles. When the second particles 51b are constituted by semiconductor particles and insulating particles, the first and second discharge electrodes 21 and 22 contain at least one of the semiconductor material constituting the semiconductor particles and the insulating material constituting the insulating particles. This makes the ESD protection device 1 unlikely to have its ESD characteristics deteriorated even when experiencing the repeated discharge. Although the exact reason is unclear, this can be because ensuring that the first and second discharge electrodes 21 and 22 contain at least one of the semiconductor material and the insulating material constituting the second particles 51b improves the adhesion between the first and second discharge electrodes 21 and 22 and the discharge-assisting section 51 and reduces the difference in the coefficient of thermal expansion between the first and second discharge electrodes 21 and 22 and the discharge-assisting section 51.

Semiconductor materials and insulating materials are substances that reduce conductivity. Thus, adding a semiconductor material or an insulating material to the discharge electrodes was formerly believed to be undesirable from the perspective of reducing the conductivity of the discharge-assisting section.

It is preferred that the total quantity of the semiconductor material and the insulating material in the first and second discharge electrodes 21 and 22 be 20% by mass or less. If a total quantity of the semiconductor material and the insulating material in the first and second discharge electrodes 21 and 22 is too large, the conductivity of the first and second discharge electrodes 21 and 22 may be reduced too much.

When the second particles 51b include insulating particles, the quantity of the insulating material in the first and second discharge electrodes 21 and 22 is preferably in the range of 1% by mass to 10% by mass. If a quantity of the insulating material in the first and second discharge electrodes 21 and 22 is too small, the prevention of the deterioration of ESD characteristics may be insufficient. If a quantity of the insulating material in the first and second discharge electrodes 21 and 22 is too large, the conductivity of the first and second discharge electrodes 21 and 22 may be reduced too much.

When the second particles 51b include semiconductor particles, the quantity of the semiconductor material in the first and second discharge electrodes 21 and 22 is preferably in the range of 1% by mass to 20% by mass. Too small a quantity of the semiconductor material in the first and second discharge electrodes 21 and 22 can cause the prevention of the deterioration of ESD characteristics to be insufficient. Too small If a quantity of the semiconductor material in the first and second discharge electrodes 21 and 22 is too small, the conductivity of the first and second discharge electrodes 21 and 22 may be reduced too much.

Coating the conductive particles with at least one of the semiconductor material and the insulating material ensures that the semiconductor material and/or the insulating material are dispersed around the conductive particles with high uniformity. Doing this therefore allows the first and second discharge electrodes 21 and 22 and the discharge-assisting section 51 to firmly adhere to each other even when the quantity of the semiconductor material and/or the insulating material added is small.

Furthermore, when a protective layer 52 is provided as in the ESD protection device 1, it is preferred that the protective layer 52 also contain, in common with the first and second discharge electrodes 21 and 22, at least one of the semiconductor material and the insulating material. This improves the adhesion between the protective layer 52 and the discharge-assisting section 51 and reduces the difference in the coefficient of the thermal expansion between the protective layer 52 and the discharge-assisting section 51. As a result, the detachment of the discharge-assisting section 51 from the protective layer 52 is also controlled, resulting in more effective prevention of the deterioration of ESD characteristics.

The following describes an example of a method for producing the ESD protection device 1.

First, ceramic green sheets for constructing the ceramic insulating material 10 are provided. The ceramic green sheets preferably contain a glass component. The ceramic green sheets may contain an alkali metal component and/or a boron component. The ceramic green sheets may contain, for example, an alkali metal oxide (e.g., potassium oxide), an alkali metal carbonate, an alkali metal nitrate, or any similar compound as an alkali metal compound.

Then, a discharge-assisting section-forming paste for constructing the discharge-assisting section is applied to a ceramic green sheet to form a layer of the discharge-assisting section-forming paste. Separately, a conductive paste for constructing the discharge electrodes is applied to a ceramic green sheet to form a layer of the conductive paste. A resin paste for creating the cavity 11 is applied to a ceramic green sheet to form a layer of the resin paste. The conductive paste for constructing the discharge electrodes contains at least one of the insulating material and the semiconductor material contained in the discharge-assisting section-forming paste. Examples of preferred resin pastes include, among others, polyethylene terephthalate resin, polypropylene resin, and acrylic resin.

Then, the ceramic green sheet with a layer of the discharge-assisting section-forming paste on its surface, the ceramic green sheet with a layer of the conductive paste on its surface, the ceramic green sheet with a layer of the resin paste on its surface, and a ceramic green sheet having no layer on its surface are appropriately stacked to build a green-sheet multilayer body.

Then, the green-sheet multilayer body is sintered. After that, the ESD protection device 1 can be completed by forming the first and second outer electrodes 31 and 32 on the sintered body through, for example, plating or baking a conductive paste. The sintering of the green-sheet multilayer body can be performed at a temperature of, for example, approximately 850° C. to 1000° C.

Figure 2:
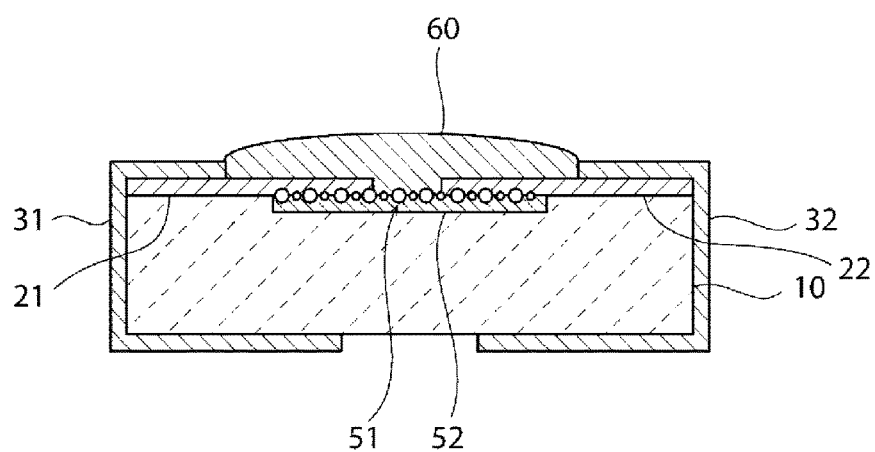
FIG. 2 is a schematic cross-sectional view of an ESD protection device according to the second embodiment.

Although this embodiment describes an example in which the first and second discharge electrodes 21 and 22 are disposed in the ceramic insulating material 10, the present invention is not limited to this structure. For example, the first and second discharge electrodes 21 and 22 may be disposed on the surface of the ceramic insulating material 10 as illustrated in FIG. 2. In this case, it is preferred that a protective layer 60 be disposed on the ceramic insulating material 10 to cover the distal end portion of each of the first and second discharge electrodes 21 and 22. The protective layer 60 can be composed of, for example, resin.

Figure 3:
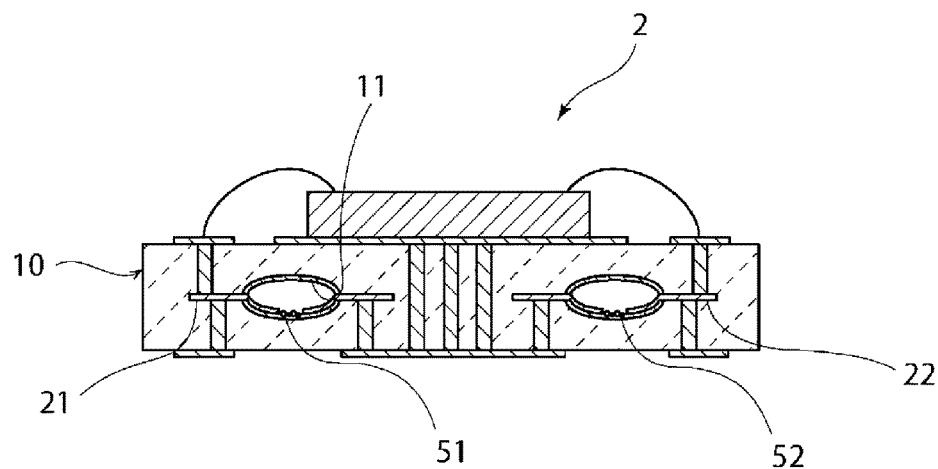
FIG. 3 is a schematic cross-sectional view of an ESD protection device according to the third embodiment.

As illustrated in FIG. 3, the ESD protection device 2 may be integral with a circuit board. In other words, the ESD protection device 2 may be a component of an ESD protection device-integrated circuit board that contains at least one ESD protection mechanism with ESD protection function.

Figure 4:
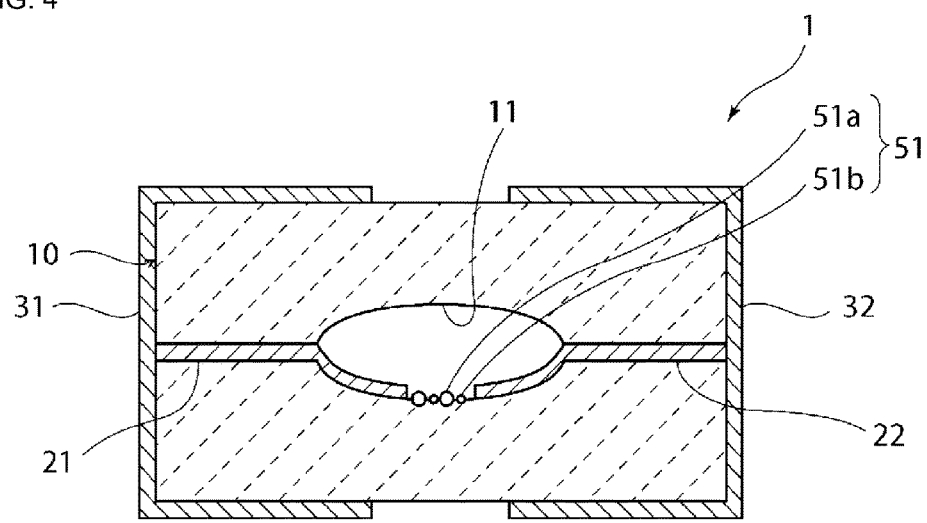
FIG. 4 is a schematic cross-sectional view of an ESD protection device according to the fourth embodiment.

Furthermore, as illustrated in FIG. 4, the ESD protection device does not necessarily have the protective layer 52.

COMPARATIVE EXAMPLE 1

An ESD protection device having a structure substantially the same as that of the ESD protection device 1 according to the above embodiment was produced using the method described in the above embodiment under the following conditions.

Ceramics used to form the ceramic insulating material: Ceramics based on Ba, Al, and Si
 Outer electrodes and inner conductors: Cu
 Dimensions of the ESD protection device: 1.0 mm long× 0.5 mm wide×0.3 mm thick
 Width of the discharge electrodes: 100 µm
 Distance of the discharge gap: 30 µm First particles for the discharge-assisting section: Aluminum-oxide-coated Cu particles having an average particle diameter of 2 μm Second particles for the discharge-assisting section: Silicon carbide particles having an average particle diameter of 0.5 μm Discharge electrodes: Cu particles having an average particle diameter of 2 μm

EXAMPLE 1

An ESD protection device was produced as in Comparative Example 1 except that the discharge electrodes additionally contained aluminum oxide particles having an average particle diameter of 0.5 μm as follows.

Discharge electrodes: Contained Cu particles having an average particle diameter of 2 μm and aluminum oxide particles having an average particle diameter 0.5 μm. The mass ratio between aluminum-oxide-coated Cu particles and silicon carbide particles in the discharge-assisting section was 90:10.

Mass ratio between Cu particles, aluminum oxide particles, and silicon carbide particles in the discharge electrodes (Cu particles:aluminum oxide particles:silicon carbide particles)=99.5:0.5:0

EXAMPLE 2

An ESD protection device was produced as in Example 1 except that the mass ratio between Cu particles, aluminum oxide particles, and silicon carbide particles in the discharge electrodes (Cu particles:aluminum oxide particles:silicon carbide particles)=99:1:0.

EXAMPLE 3

An ESD protection device was produced as in Example 1 except that the mass ratio between Cu particles, aluminum oxide particles, and silicon carbide particles in the discharge electrodes (Cu particles:aluminum oxide particles:silicon carbide particles)=95:5:0.

EXAMPLE 4

An ESD protection device was produced as in Example 1 except that the mass ratio between Cu particles, aluminum oxide particles, and silicon carbide particles in the discharge electrodes (Cu particles:aluminum oxide particles:silicon carbide particles)=90:10:0.

EXAMPLE 5

An ESD protection device was produced as in Example 1 except that the mass ratio between Cu particles, aluminum oxide particles, and silicon carbide particles in the discharge electrodes (Cu particles:aluminum oxide particles:silicon carbide particles)=80:20:0.

EXAMPLE 6

An ESD protection device was produced as in Comparative Example 1 except that the discharge electrodes additionally contained silicon carbide particles having an average particle diameter of 0.5 μm as follows.

Discharge electrodes: Contained Cu particles having an average particle diameter of 2 μm and silicon carbide particles having an average particle diameter 0.5 μm.

Mass ratio between Cu particles, aluminum oxide particles, and silicon carbide particles in the discharge electrodes (Cu particles:aluminum oxide particles:silicon carbide particles)=99.5:0:0.5

EXAMPLE 7

An ESD protection device was produced as in Example 6 except that the mass ratio between Cu particles, aluminum oxide particles, and silicon carbide particles in the discharge electrodes (Cu particles:aluminum oxide particles:silicon carbide particles)=99:0:1.

EXAMPLE 8

An ESD protection device was produced as in Example 6 except that the mass ratio between Cu particles, aluminum oxide particles, and silicon carbide particles in the discharge electrodes (Cu particles:aluminum oxide particles:silicon carbide particles)=95:0:5.

EXAMPLE 9

An ESD protection device was produced as in Example 6 except that the mass ratio between Cu particles, aluminum oxide particles, and silicon carbide particles in the discharge electrodes (Cu particles:aluminum oxide particles:silicon carbide particles)=90:0:10.

EXAMPLE 10

An ESD protection device was produced as in Example 6 except that the mass ratio between Cu particles, aluminum oxide particles, and silicon carbide particles in the discharge electrodes (Cu particles:aluminum oxide particles:silicon carbide particles)=80:0:20.

EXAMPLE 11

An ESD protection device was produced as in Comparative Example 1 except that the discharge electrodes additionally contained aluminum oxide particles having an average particle diameter of 0.5 μm and silicon carbide particles having an average particle diameter of 0.5 μm as follows.

Discharge electrodes: Contained Cu particles having an average particle diameter of 2 μm, aluminum oxide particles having an average particle diameter 0.5 μm, and silicon carbide particles having an average particle diameter 0.5 μm.

Mass ratio between Cu particles, aluminum oxide particles, and silicon carbide particles in the discharge electrodes (Cu particles:aluminum oxide particles:silicon carbide particles)=99:0.5:0.5

EXAMPLE 12

An ESD protection device was produced as in Example 11 except that the mass ratio between Cu particles, aluminum oxide particles, and silicon carbide particles in the discharge electrodes (Cu particles:aluminum oxide particles:silicon carbide particles)=95:2.5:2.5.

EXAMPLE 13

An ESD protection device was produced as in Example 11 except that the mass ratio between Cu particles, aluminum oxide particles, and silicon carbide particles in the discharge electrodes (Cu particles:aluminum oxide particles:silicon carbide particles)=90:5:5.

EXAMPLE 14

An ESD protection device was produced as in Example 11 except that the mass ratio between Cu particles, aluminum oxide particles, and silicon carbide particles in the discharge electrodes (Cu particles:aluminum oxide particles:silicon carbide particles)=80:10:10.

(Evaluation of the Response to the Discharge)

The response to the discharge of the ESD protection device produced in each of Comparative Example 1 and Examples 1 to 14 was evaluated through the electrostatic discharge immunity test outlined in IEC Standard IEC 61000-4-2. The devices were graded as having poor (×), good (○), and excellent (◉) response to the discharge if the peak voltage detected at the protection circuit was more than 700 V, in the range of 500 V to 700 V, and less than 500 V, respectively. The results are summarized in Table 1.

(Evaluation of the Durability During the Repeated Discharge)

The durability of the ESD protection device produced in each of Comparative Example 1 and Examples 1 to 14 upon the repeated instances of discharge was evaluated. More specifically, contact discharge was first induced 100 times at an applied voltage of 8 kV, and then the above-described evaluation of the response to the discharge was performed. Then, the contact discharge was induced another 200 times (a total of 300 times), and the above-described evaluation of the response to the discharge was performed. Then, the contact discharge was induced another 200 times (a total of 500 times), and the above-described evaluation of the response to the discharge was performed. After that, contact discharge was induced another 500 times (a total of 1000 times), and the above-described evaluation of the response to the discharge was performed. The results are summarized in Table 1.

EXAMPLE 15

An ESD protection device was produced as in Comparative Example 1 except that an 80% by mass equivalent of the Cu particles contained in the discharge electrodes were changed to aluminum-oxide-coated Cu particles. In Example 15, the aluminum oxide content of the discharge electrodes was 0.5% by mass.

EXAMPLE 16

An ESD protection device was produced as in Example 15 except that the aluminum oxide content of the discharge electrodes was 1% by mass.

EXAMPLE 17

An ESD protection device was produced as in Example 15 except that the aluminum oxide content of the discharge electrodes was 3% by mass.

EXAMPLE 18

An ESD protection device was produced as in Example 15 except that the aluminum oxide content of the discharge electrodes was 5% by mass.

EXAMPLE 19

An ESD protection device was produced as in Comparative Example 1 except that an 80% by mass equivalent of the Cu particles contained in the discharge electrodes were changed to silicon-carbide-coated Cu particles. In Example 19, the silicon carbide content of the discharge electrodes was 0.5% by mass.

EXAMPLE 20

An ESD protection device was produced as in Example 15 except that the silicon carbide content of the discharge electrodes was 1% by mass.

TABLE 1

| | Quantity in the discharge electrodes (% by mass) | | | | Durability during repeated discharge | | | |
|---|---|---|---|---|---|---|---|---|
| | Cu particles | Aluminum oxide particles | Silicon carbide particles | Response to discharge | 100 times | 300 times | 500 times | 1000 times |
| Comparative Example 1 | 100 | 0 | 0 | ◉ | ◉ | ○ | × | × |
| Example 1 | 99.5 | 0.5 | 0 | ◉ | ◉ | ○ | ○ | ○ |
| Example 2 | 99 | 1 | 0 | ◉ | ◉ | ◉ | ◉ | ◉ |
| Example 3 | 95 | 5 | 0 | ◉ | ◉ | ◉ | ◉ | ◉ |
| Example 4 | 90 | 10 | 0 | ◉ | ◉ | ◉ | ◉ | ◉ |
| Example 5 | 80 | 20 | 0 | ○ | ○ | ○ | ○ | ○ |
| Example 6 | 99.5 | 0 | 0.5 | ◉ | ◉ | ○ | ○ | ○ |
| Example 7 | 99 | 0 | 1 | ◉ | ◉ | ◉ | ◉ | ◉ |
| Example 8 | 95 | 0 | 5 | ◉ | ◉ | ◉ | ◉ | ◉ |
| Example 9 | 90 | 0 | 10 | ◉ | ◉ | ◉ | ◉ | ◉ |
| Example 10 | 80 | 0 | 20 | ◉ | ◉ | ◉ | ◉ | ◉ |
| Example 11 | 99 | 0.5 | 0.5 | ◉ | ◉ | ◉ | ◉ | ◉ |
| Example 12 | 95 | 2.5 | 2.5 | ◉ | ◉ | ◉ | ◉ | ◉ |
| Example 13 | 90 | 5 | 5 | ◉ | ◉ | ◉ | ◉ | ◉ |
| Example 14 | 80 | 10 | 10 | ◉ | ◉ | ◉ | ◉ | ◉ |

EXAMPLE 21

An ESD protection device was produced as in Example 15 except that the silicon carbide content of the discharge electrodes was 3% by mass.

EXAMPLE 22

An ESD protection device was produced as in Example 15 except that the silicon carbide content of the discharge electrodes was 5% by mass.

The ESD protection device produced in each of Examples 15 to 22 was also subjected to the evaluation of the response to the discharge and the evaluation of the durability during the repeated discharge in the same way as Example 1 etc. The results are summarized in Tables 2 and 3.

TABLE 2

| | Aluminum oxide content of the discharge electrodes (% by mass) | Response to discharge | Durability during repeated discharge | | | |
|---|---|---|---|---|---|---|
| | | | 100 times | 300 times | 500 times | 1000 times |
| Comparative Example 1 | 0 | ⊙ | ⊙ | ○ | X | X |
| Example 15 | 0.5 | ⊙ | ⊙ | ⊙ | ⊙ | ⊙ |
| Example 16 | 1 | ⊙ | ⊙ | ⊙ | ⊙ | ⊙ |
| Example 17 | 3 | ⊙ | ⊙ | ⊙ | ⊙ | ⊙ |
| Example 18 | 5 | ⊙ | ⊙ | ⊙ | ⊙ | ⊙ |

TABLE 3

| | Silicon carbide content of the discharge electrodes (% by mass) | Response to discharge | Durability during repeated discharge | | | |
|---|---|---|---|---|---|---|
| | | | 100 times | 300 times | 500 times | 1000 times |
| Comparative Example 1 | 0 | ⊙ | ⊙ | ○ | X | X |
| Example 19 | 0.5 | ⊙ | ⊙ | ⊙ | ⊙ | ⊙ |
| Example 20 | 1 | ⊙ | ⊙ | ⊙ | ⊙ | ⊙ |
| Example 21 | 3 | ⊙ | ⊙ | ⊙ | ⊙ | ⊙ |
| Example 22 | 5 | ⊙ | ⊙ | ⊙ | ⊙ | ⊙ |

As can be seen from the results summarized in Tables 1 to 3, ensuring that the discharge electrodes contain at least one of the insulating material and the semiconductor material contained in the discharge-assisting section limits the decline in the response to the discharge and leads to the controlled deterioration of ESD characteristics upon the repeated discharge.

REFERENCE SIGNS LIST 1, 2 . . . ESD protection device
10 . . . Ceramic insulating material
11 . . . Cavity
21 . . . First discharge electrode
22 . . . Second discharge electrode
31 . . . First outer electrode
32 . . . Second outer electrode
51 . . . Discharge-assisting section
51a . . . First particles
51b . . . Second particles
52 . . . Protective layer
60 . . . Protective layer

The invention claimed is:

1. An ESD protection device comprising:
a ceramic insulating material,
a first discharge electrode and a second discharge electrode disposed in or on the ceramic insulating material, and
a discharge-assisting section located between a distal end portion of the first discharge electrode and a distal end portion of the second discharge electrode, the discharge-assisting section being an electrode configured to reduce a discharge starting voltage between the first discharge electrode and the second discharge electrode and comprising a sintered body including conductive particles and at least one of semiconductor particles and insulating particles, wherein
each of the first and second discharge electrodes comprises at least one of a semiconductor material constituting the semiconductor particles and an insulating material constituting the insulating particles.

2. The ESD protection device according to claim 1, wherein a total content of the semiconductor material and the insulating material in the first and second discharge electrodes is 20% by mass or less.

3. The ESD protection device according to claim 2, wherein a content of the insulating material in the first and second discharge electrodes is in a range of 1% by mass to 10% by mass.

4. The ESD protection device according to claim 2, wherein a content of the semiconductor material in the first and second discharge electrodes is in a range of 1% by mass to 20% by mass.

5. The ESD protection device according to claim 1, wherein the first and second discharge electrodes comprises a conductive particle coated with at least one of the semiconductor material and the insulating material.

6. The ESD protection device according to claim 1, wherein the first and second discharge electrodes are disposed on a surface of the ceramic insulating material.

7. The ESD protection device according to claim 1, wherein the first and second discharge electrodes are disposed inside the ceramic insulating material.

8. The ESD protection device according to claim 7, wherein
the ceramic insulating material comprises a cavity, and
the distal end portion of the first discharge electrode and the distal end portion of the second discharge electrode are located in the cavity.

9. The ESD protection device according to claim 1, further comprising
a first outer electrode located on the ceramic insulating material and electrically connected to the first discharge electrode, and
a second outer electrode located on the ceramic insulating material and electrically connected to the second discharge electrode.

10. The ESD protection device according to claim 2, wherein a content of the semiconductor material in the first and second discharge electrodes is in a range of 1% by mass to 20% by mass.

11. The ESD protection device according to claim 2, wherein the first and second discharge electrodes comprises a conductive particle coated with at least one of the semiconductor material and the insulating material.

12. The ESD protection device according to claim 3, wherein the first and second discharge electrodes comprises a conductive particle coated with at least one of the semiconductor material and the insulating material.

13. The ESD protection device according to claim 4, wherein the first and second discharge electrodes comprises a conductive particle coated with at least one of the semiconductor material and the insulating material.

14. The ESD protection device according to claim 2, wherein the first and second discharge electrodes are disposed on a surface of the ceramic insulating material.

15. The ESD protection device according to claim 3, wherein the first and second discharge electrodes are disposed on a surface of the ceramic insulating material.

16. The ESD protection device according to claim 4, wherein the first and second discharge electrodes are disposed on a surface of the ceramic insulating material.

17. The ESD protection device according to claim 5, wherein the first and second discharge electrodes are disposed on a surface of the ceramic insulating material.

18. The ESD protection device according to claim 2, wherein the first and second discharge electrodes are disposed inside the ceramic insulating material.

19. The ESD protection device according to claim 3, wherein the first and second discharge electrodes are disposed inside the ceramic insulating material.

20. The ESD protection device according to claim 4, wherein the first and second discharge electrodes are disposed inside the ceramic insulating material.

* * * * *